United States Patent
Liu et al.

(10) Patent No.: US 11,788,795 B2
(45) Date of Patent: Oct. 17, 2023

(54) VAPOR CHAMBER

(71) Applicant: VAST GLORY ELECTRONICS & HARDWARE & PLASTIC(HUI ZHOU) LTD., Hui Zhou (CN)

(72) Inventors: Lei Lei Liu, Hui Zhou (CN); Xiao Min Zhang, Hui Zhou (CN); Xue Mei Wang, Hui Zhou (CN)

(73) Assignee: VAST GLORY ELECTRONICS & HARDWARE & PLASTIC(HUI ZHOU) LTD., Hui Zhou (CN)

( * ) Notice: Subject to any disclaimer, the term of this patent is extended or adjusted under 35 U.S.C. 154(b) by 117 days.

(21) Appl. No.: 16/899,495

(22) Filed: Jun. 11, 2020

(65) Prior Publication Data

US 2021/0195799 A1    Jun. 24, 2021

(30) Foreign Application Priority Data

Dec. 23, 2019    (CN) .......................... 201911340537.1

(51) Int. Cl.
*F28D 15/02*    (2006.01)
*F28D 15/04*    (2006.01)

(52) U.S. Cl.
CPC ........ *F28D 15/0233* (2013.01); *F28D 15/046* (2013.01)

(58) Field of Classification Search
CPC .... F28D 15/0233; F28D 15/046; F28D 15/02; F28D 15/0266; F28D 15/04; H01L 23/427
See application file for complete search history.

(56) References Cited

U.S. PATENT DOCUMENTS

| | | | |
|---|---|---|---|
| 2010/0157533 A1* | 6/2010 | Oniki | H05K 7/20336 |
| | | | 29/890.032 |
| 2013/0025829 A1* | 1/2013 | Huang | F28D 15/0233 |
| | | | 165/104.26 |
| 2019/0226770 A1* | 7/2019 | Cheng | F28F 3/12 |
| 2019/0339021 A1* | 11/2019 | Tseng | H01L 23/427 |
| 2020/0003501 A1* | 1/2020 | Wakaoka | H05K 7/20 |

FOREIGN PATENT DOCUMENTS

WO    WO-2019065728 A1 *   4/2019   ......... F28D 15/0233

* cited by examiner

*Primary Examiner* — Tavia Sullens
*Assistant Examiner* — Khaled Ahmed Ali Al Samiri
(74) *Attorney, Agent, or Firm* — Maschoff Brennan

(57) ABSTRACT

This disclosure relates to a vapor chamber configured to accommodate a cooling fluid. The vapor chamber includes a first cover, a second cover, a first capillary structure, and a second capillary structure. The second cover and the first cover are attached to each other to form a chamber therebetween. The chamber is configured to accommodate the cooling fluid. The first capillary structure is located in the chamber and stacked on the first cover. The second capillary structure is located in the chamber and stacked on the first capillary structure. The second capillary structure is different from the first capillary structure. A projection of the second capillary structure onto the first cover is smaller than a projection of the first capillary structure onto the first cover.

29 Claims, 14 Drawing Sheets

US 11,788,795 B2

VAPOR CHAMBER

CROSS-REFERENCE TO RELATED APPLICATIONS

This non-provisional application claims priority under 35 U.S.C. § 119(a) on Patent Application No(s). 201911340537.1 filed in China, P.R.C. on Dec. 23, 2019, the entire contents of which are hereby incorporated by reference.

TECHNICAL FIELD

The present disclosure relates to a vapor chamber, more particularly to a vapor chamber having multiple forms of capillary structures.

BACKGROUND

A vapor chamber and a heat pipe can be applied to dissipate heat. Thermal conduction of a heat pipe occurs in one dimension while thermal conduction of a vapor chamber occurs in two dimensions. Therefore, the vapor chamber is more effective in heat dissipation. Generally, the vapor chamber includes a chamber body and a capillary structure, the chamber body has a chamber for accommodating cooling fluid, and the capillary structure is distributed in the chamber. The chamber body contains an evaporation area and a condensation area. The cooling fluid absorbs heat and is vaporized in the evaporation area. And the vaporized cooling fluid is condensed in the condensation area and then returned to the evaporation area via the capillary structure to form a circulation.

However, with the increasing demand for lightweight and small electronic products, some vapor chambers are in an irregular shape to avoid structural interference with nearby electrical components. This shape of vapor chamber inevitably has a narrow portion, where the narrow portion has a small cross-section for the distribution of the capillary structure so that the cooling fluid is often stuck in this area and unable to complete the circulation, especially when the vapor chamber is placed vertically.

SUMMARY

The present disclosure provides a vapor chamber that has an improved ability to circulate cooling fluid.

According to one aspect of the present disclosure, a vapor chamber is configured to accommodate a cooling fluid. The vapor chamber includes a first cover, a second cover, a first capillary structure, and a second capillary structure. The second cover and the first cover are attached to each other to form a chamber therebetween. The chamber is configured to accommodate the cooling fluid. The first capillary structure is located in the chamber and stacked on the first cover. The second capillary structure is located in the chamber and stacked on the first capillary structure. The second capillary structure is different from the first capillary structure, and a projection of the second capillary structure onto the first cover is smaller than a projection of the first capillary structure onto the first cover.

According to another aspect of the present disclosure, a vapor chamber is configured to accommodate a cooling fluid. The vapor chamber includes a first cover, a second cover, a first capillary structure, and a second capillary structure. The second cover and the first cover are attached to each other to form a chamber therebetween. The chamber is configured to accommodate the cooling fluid. The first capillary structure is located in the chamber and stacked on the first cover. The second capillary structure is located in the chamber and stacked on the first capillary structure. The second capillary structure has a capability of transmitting the cooling fluid stronger than that of the first capillary structure.

According to the vapor chamber discussed above, when the vapor chamber is placed vertically and the evaporation area is located higher than the condensation area, or when the evaporation area and the condensation area have a relative long distance inbetween, the condensed cooling fluid in the condensation area still can be transmitted back to the evaporation area with the help of the second capillary structure and the first capillary structure to complete the circulation.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
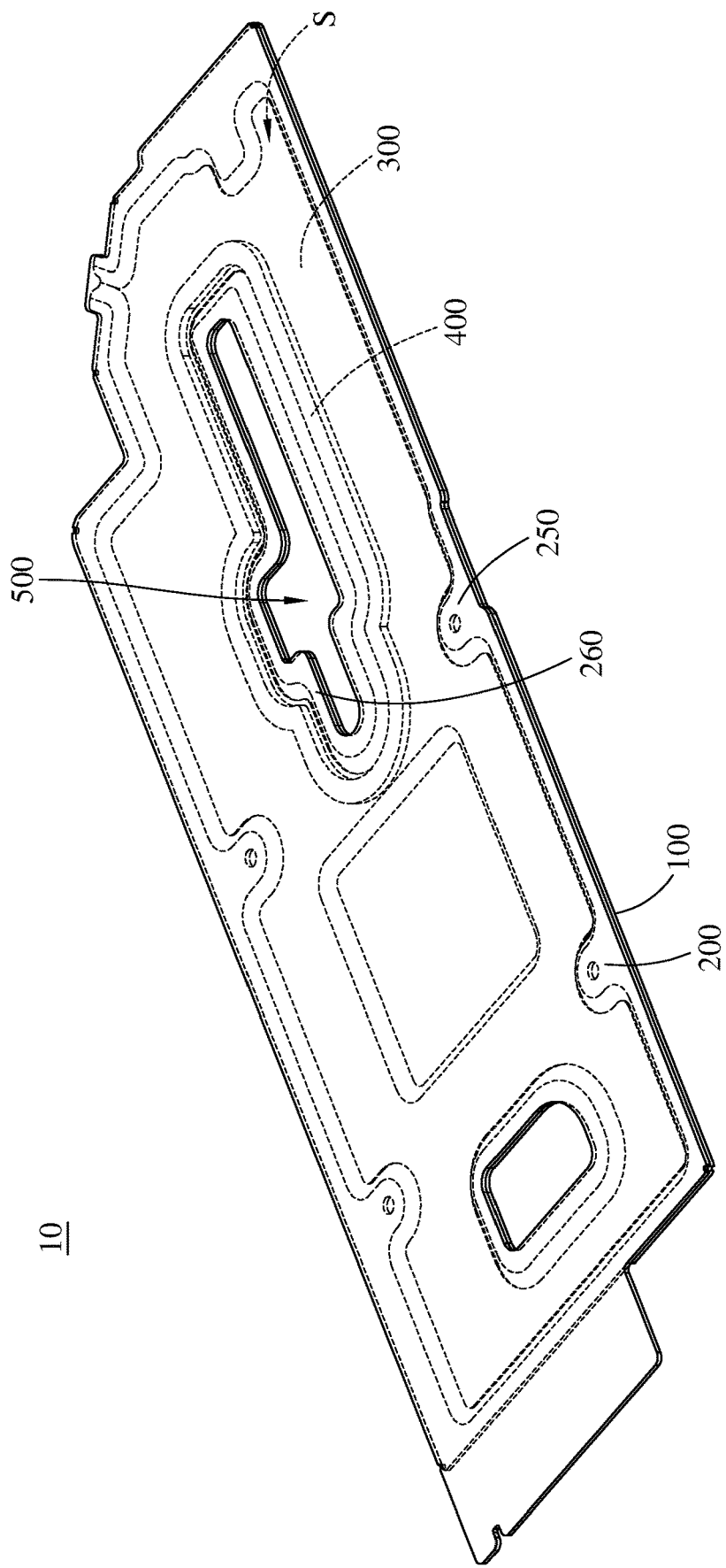
FIG. 1 is a perspective view of a vapor chamber according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
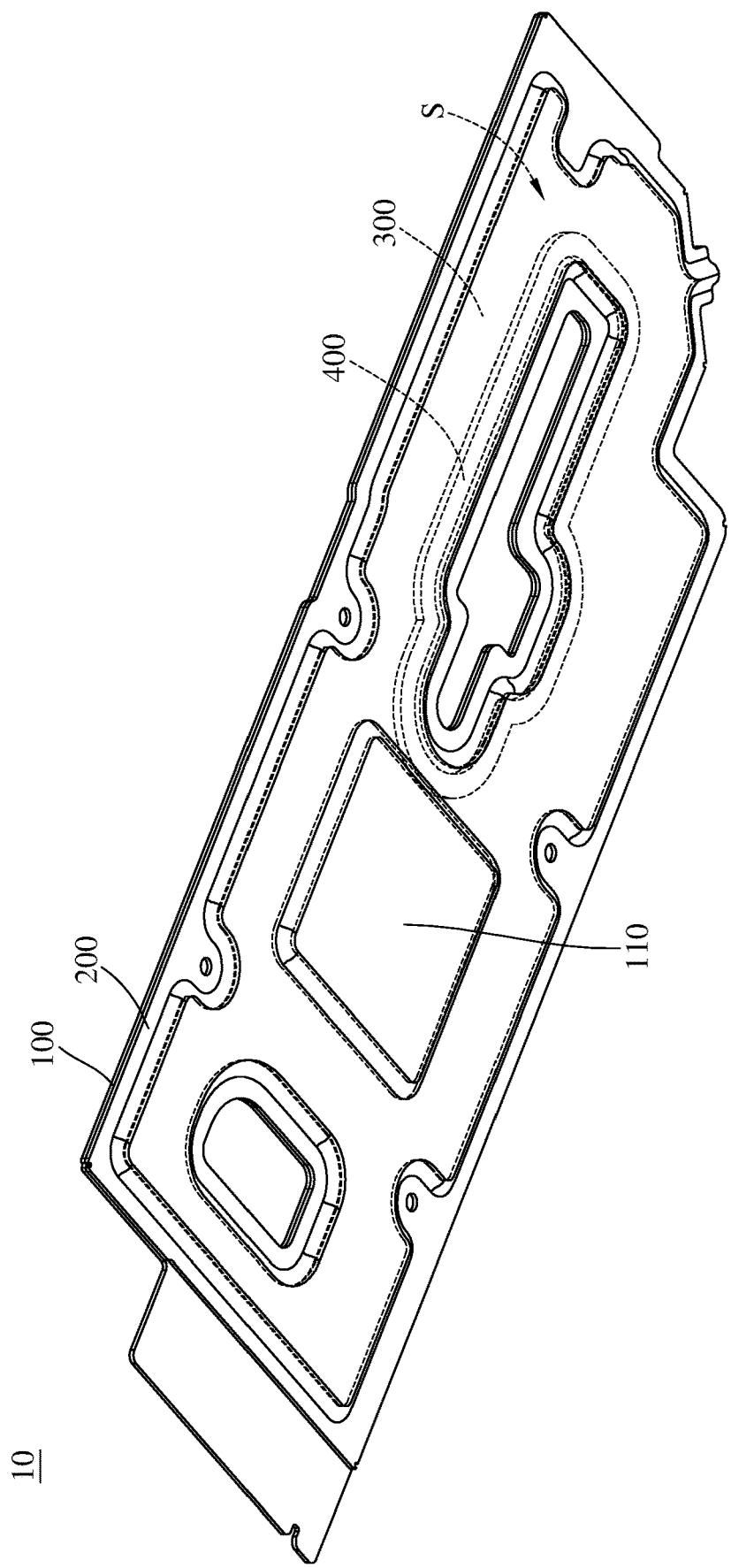
FIG. 2 is another perspective view of the vapor chamber in FIG. 1.
Figure 3:
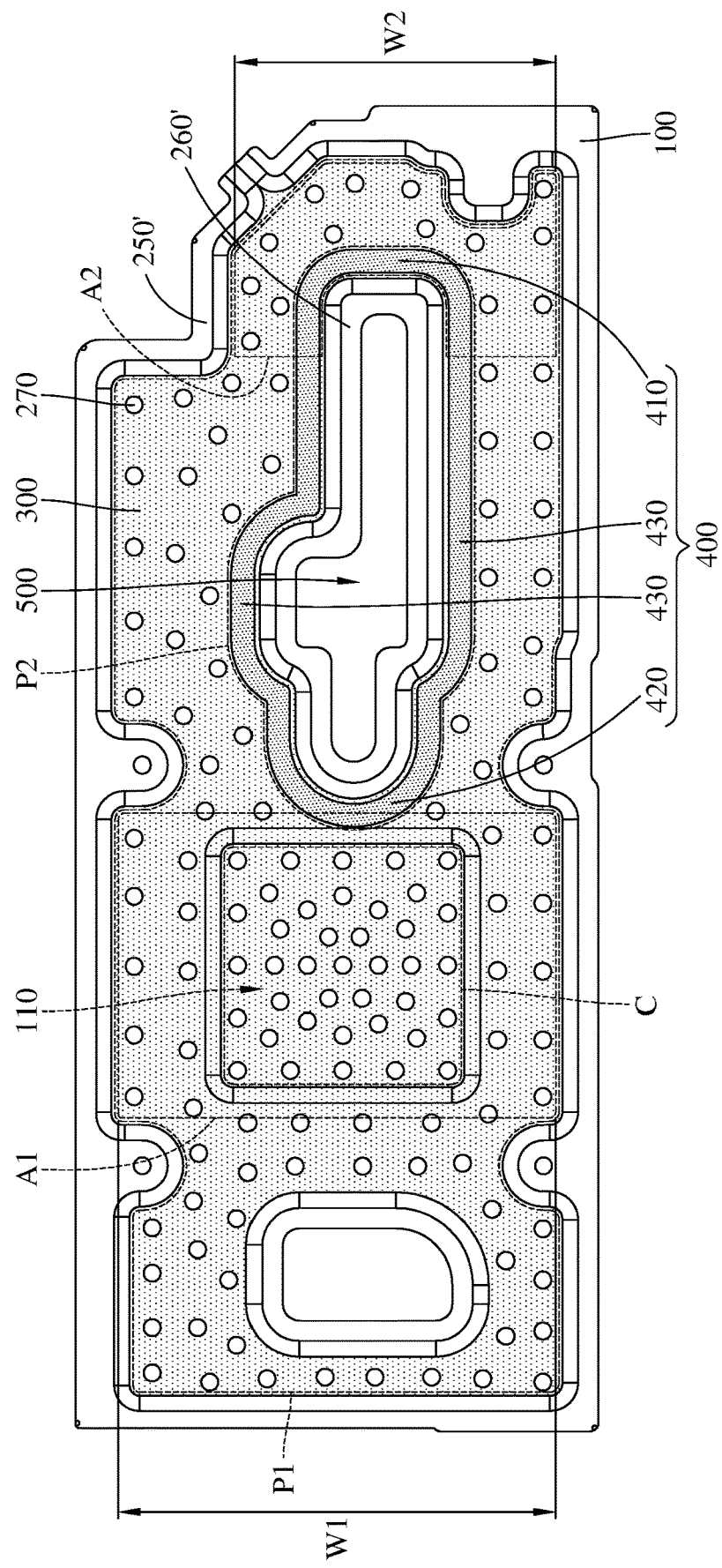
FIG. 3 is a plan view showing that the vapor chamber in FIG. 1 without the second cover.
Figure 4:
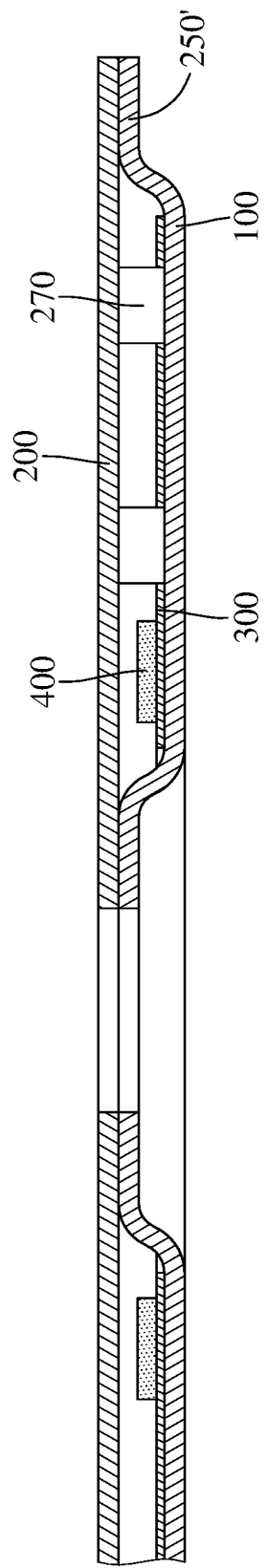
FIG. 4 is a cross-sectional view of the vapor chamber in FIG. 1.

Please refer to FIG. 1 to FIG. 4, wherein FIG. 1 is a perspective view of a vapor chamber according to a first embodiment of the present disclosure, FIG. 2 is another perspective view of the vapor chamber in FIG. 1, FIG. 3 is a plan view showing that the vapor chamber in FIG. 1 without the second cover, and FIG. 4 is a cross-sectional view of the vapor chamber in FIG. 1.

This embodiment provides a vapor chamber 10 configured to accommodate a cooling fluid (not shown). The vapor chamber 10 includes a first cover 100, a second cover 200, a first capillary structure 300, and a second capillary structure 400.

The first cover 100 and the second cover 200 are made of, for example, oxygen-free copper, silicon-containing copper alloy, or phosphorous copper alloy. The second cover 200 and the first cover 100 are attached to each other to form a chamber S therebetween. The cooling fluid is accommodated in the chamber S.

In this embodiment, the vapor chamber 10 may further include a plurality of supporting posts 270. The supporting posts 270 are in physical contact with the first cover 100 and the second cover 200. The supporting posts 270 are able to maintain the gap between the first cover 100 and the second cover 200 and to strengthen the structural strength of the vapor chamber 10.

In this embodiment, the vapor chamber 10 further includes a hollow part 500. The hollow part 500 is, for example, a through hole formed on the first cover 100 and the second cover 200, but the hollow part 500 does not affect the airtightness of the chamber S. Specifically, there are an outer seal part 250 and an inner seal part 260 provided along the contours of the first cover 100 and the second cover 200, where the outer seal part 250 goes along the outer edges of the first cover 100 and the second cover 200, and the inner seal part 260 goes along the contour of the hollow part 500. Note that the contours of the outer seal part 250 and the inner seal part 260 may be in irregular shapes to avoid structural interference with nearby electrical components (not shown), but the present disclosure is not limited thereto. In some embodiments, the outer seal part and the inner seal part in irregular shapes may have a zigzag structure, a curved structure or an uneven structure. In some other embodiments, the contours of the outer seal part and the inner seal part may be in a regular shape, such as rectangle, oval, or circle.

In this embodiment, the chamber S has an evaporation area A1 and a condensation area A2. As shown, due to the existence of the hollow part 500 and the irregular shape, the condensation area A2 is narrower than the evaporation area A1 (W2 is smaller than W1).

In this embodiment, the first cover 100 has a contact surface 110 corresponding to the evaporation area A1. The contact surface 110 is configured to be in thermal contact with a heat source (not shown).

The first capillary structure 300 and the second capillary structure 400 are located in the chamber S. The first capillary structure 300 is stacked on the first cover 100, and the second capillary structure 400 is stacked on the first capillary structure 300. The second capillary structure 400 is different from the first capillary structure 300. An orthogonal projection of the second capillary structure 400 onto the first cover 100 is smaller than that of the first capillary structure 300 onto the first cover 100. The orthogonal projection is also known as the orthographic projection. Note that the orthogonal projections are projected along the same direction perpendicular to the surface of the first cover 100. Note that the orthogonal projection is for the purpose of description and is not intended to limit the present disclosure. In some embodiments, the relationship between the first capillary structure 300 and the second capillary structure 400 can be described using their oblique projections, where the oblique projections are projected along the same direction which is at an acute or obtuse angle to the surface of the first cover 100.

In this embodiment, the first capillary structure 300 is made of, for example, a metal mesh, and the second capillary structure 400 is made from, for example, sintered powder, however, the present disclosure is not limited thereto. The first capillary structure 300 and the second capillary structure 400 may be made of different materials. In one embodiment, the first capillary structure 300 is made of gold, and the second capillary structure 400 is made of copper. In another embodiment, the first capillary structure 300 and the second capillary structure 400 are made of different alloys. In addition, the first capillary structure 300 and the second capillary structure 400 may be different in the form of capillary. In one embodiment, the first capillary structure 300 may be in one form of having groove structure, mesh structure, fiber structure, or sintered powder structure, and the second capillary structure 400 may be in another form of having groove structure, mesh structure, fiber structure, or sintered powder structure. The first capillary structure 300 and the second capillary structure 400 may be in the same type but have different pore sizes; in one embodiment, the first capillary structure 300 and the second capillary structure 400 are in the form having mesh structure, but the pores of the first capillary structure 300 are larger than that of the second capillary structure 400.

In this embodiment, as shown, the first capillary structure 300 is distributed throughout the chamber S, and the second capillary structure 400 is distributed in part of the chamber S. One side of the second capillary structure 400 is located in the condensation area A2 and another side of the second capillary structure 400 extends towards the evaporation area A1. However, the distributions of the first capillary structure 300 and the second capillary structure 400 in the chamber S are not restricted; in some embodiments, the first capillary structure may also be merely distributed in part of the chamber S as long as the orthogonal projection of the second capillary structure onto the first cover is smaller than that of the first capillary structure onto the first cover.

In this embodiment, the orthogonal projection of the second capillary structure 400 onto the first cover 100 does not overlap with the contact surface 110, where the range of the contact surface 110 on the first cover 100 is illustrated as the area C. Specifically, the second capillary structure 400 is in a ring-shape and has a first curved section 410, a second curved section 420, and two extension sections 430. The first curved section 410 and the second curved section 420 are located opposite to each other. The first curved section 410 is located in the condensation area A2, and at least part of the second curved section 420 is located in the evaporation area A1. An orthogonal projection of the second curved section 420 onto the first cover 100 is located out of and substantially located next to the area C of the contact surface 110 of the first cover 100. The extension sections 430 are located opposite to each other. The extension sections 430 are respectively located between and connected to the first curved section 410 and the second curved section 420. In such an arrangement, the cooling fluid in the condensation area A2 will be transmitted to a place near the contact surface 110 in the evaporation area A1 via the second capillary structure 400 and then be transmitted to the contact surface 110 in the evaporation area A1 via the first capillary structure 300.

In this embodiment, the second capillary structure 400 is in a ring-shape and located at the periphery of the hollow part 500. In other words, the second capillary structure 400 surrounds the hollow part 500. In addition, the second capillary structure 400 is located close to an attachment surface 260' of the inner seal part 260 but is located away from an attachment surface 250' of the outer seal part 250. As shown, the distance between the second capillary structure 400 and the attachment surface 260' is smaller than the distance between the second capillary structure 400 and the attachment surface 250'. Such an arrangement of the second capillary structure 400 in the chamber S makes the chamber S has a large available room for the vaporized cooling fluid to flow, ensuring the flowing of the cooling fluid in the chamber S.

In addition, as shown in FIG. 4, in this embodiment, the second capillary structure 400 is spaced apart from the second cover 200. That is, the second capillary structure 400 is not in directly thermally conductive contact with the second cover 200.

When the vapor chamber 10 is placed vertically and the evaporation area A1 is located higher than the condensation area A2, or when the evaporation area A1 and the condensation area A2 have a relative long distance inbetween, the condensed cooling fluid in the condensation area A2 still can be transmitted back to the evaporation area A1 with the help of the second capillary structure 400 and the first capillary structure 300 to complete the circulation.

In this embodiment, the vapor chamber 10 may be manufactured by the following steps: firstly, the first capillary structure 300 is sintered on the first cover 100; then, the second capillary structure 400 being pre-sintered is stacked on the first capillary structure 300; then, the first cover 100 and the second cover 200 are soldered to each other. Note that the second capillary structure 400 is not necessary to be pre-sintered; in some embodiments, the second capillary structure may be produced by placing capillary material on the first capillary structure and sintering it.

Figure 5:
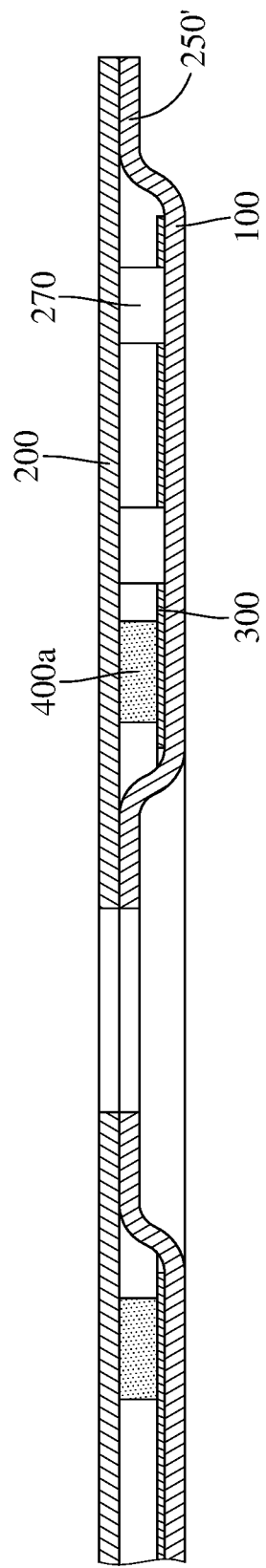
FIG. 5 is a cross-sectional view of a vapor chamber according to a second embodiment of the present disclosure.

In the above embodiment, the second capillary structure 400 is spaced apart from the second cover 200, but the present disclosure is not limited thereto. Please refer to FIG. 5, which is a cross-sectional view of a vapor chamber according to a second embodiment of the present disclosure. Note that only the main differences between the following embodiments and the previous embodiment will be described hereinafter. And the same numbers refer to the same or similar features. In this embodiment, the second capillary structure 400a is in thermal contact with the second cover 200 so as to enhance the heat exchange efficiency.

Figure 6:
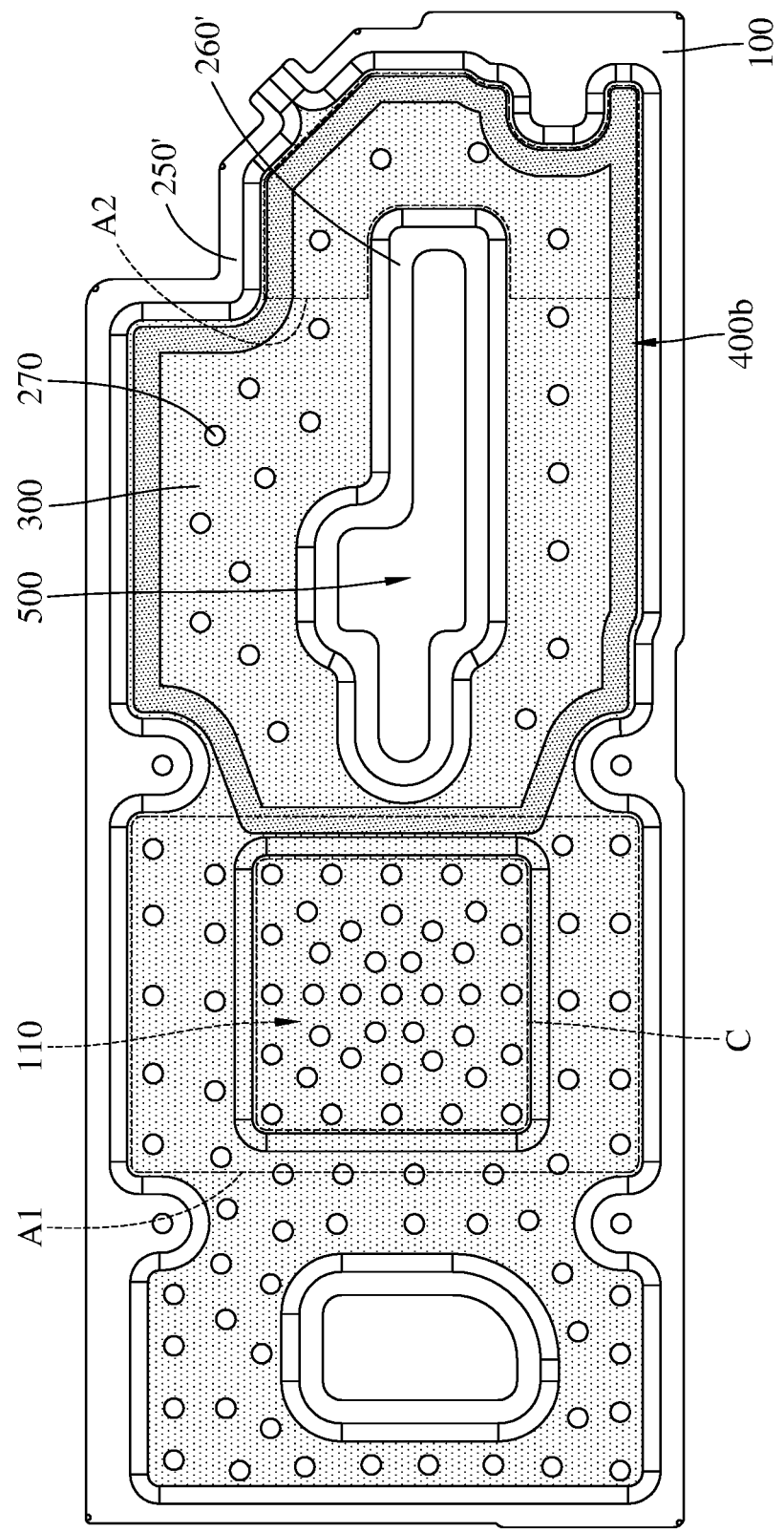
FIG. 6 is a plan view showing that a vapor chamber without a second cover according to a third embodiment of the present disclosure.

In the above embodiments, the second capillary structure 400 is located close to the attachment surface 260' of the inner seal part 260. However, the present disclosure is not limited thereto. Please refer to FIG. 6, which is a plan view showing that a vapor chamber without a second cover according to a third embodiment of the present disclosure. In this embodiment, the second capillary structure 400b is located close to the attachment surface 250' of the outer seal part 250 (shown in FIG. 1). Such an arrangement of the second capillary structure 400b in the chamber S makes the chamber S has a large available room for the vaporized cooling fluid to flow, ensuring the flowing of the cooling fluid in the chamber S.

Figure 7:
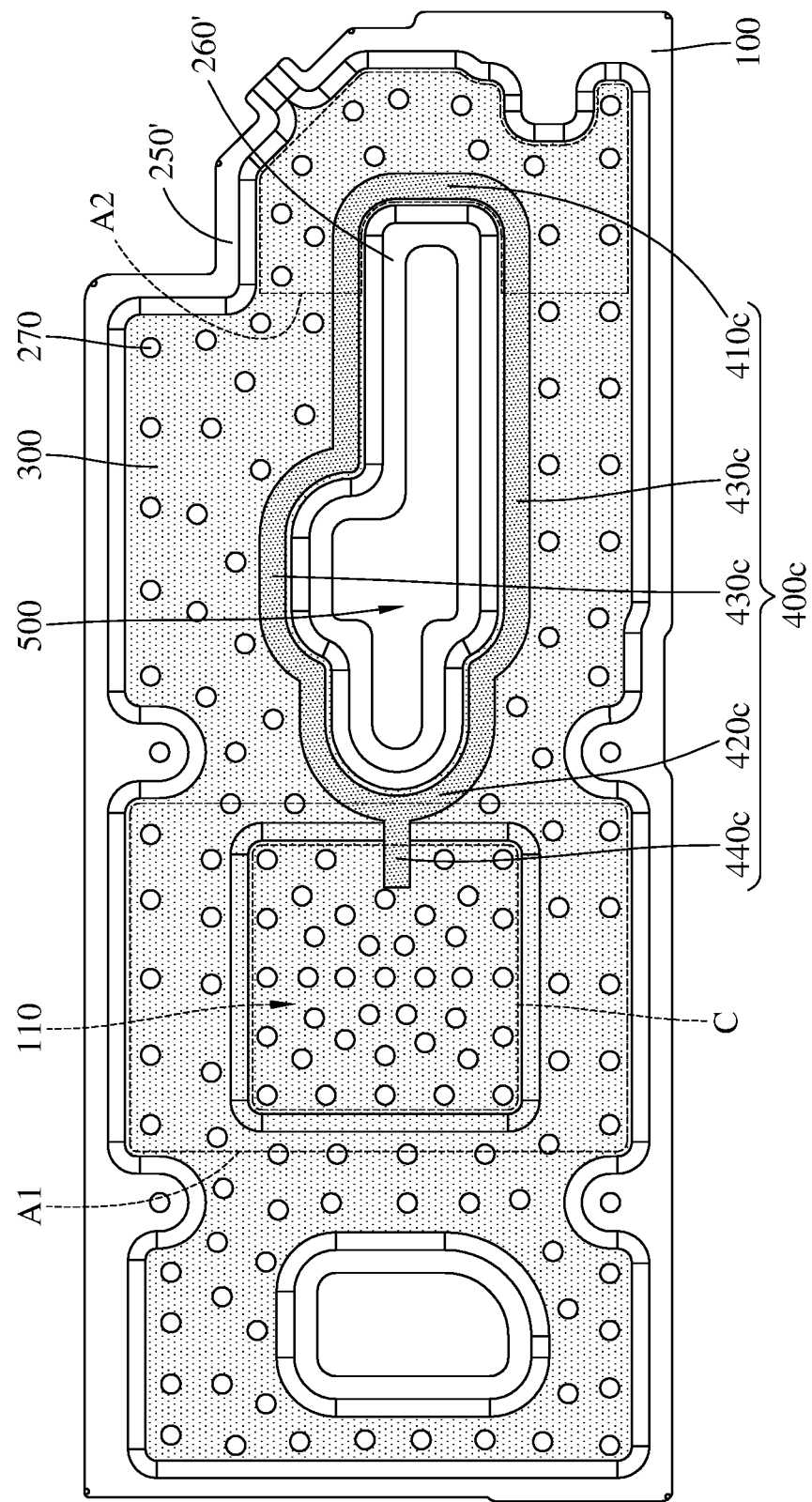
FIG. 7 is a plan view showing that a vapor chamber without a second cover according to a fourth embodiment of the present disclosure.

In the above embodiments, the orthogonal projection of the second capillary structure 400 onto the first cover 100 is located out of the area C of the contact surface 110 of the first cover 100. However, the present disclosure is not limited thereto. Please refer to FIG. 7, which is a plan view showing that a vapor chamber without a second cover according to a fourth embodiment of the present disclosure. In this embedment, part of the orthogonal projection of the second capillary structure 400c onto the first cover 100 is located in the area C of the contact surface 110 of the first cover 100. Specifically, the second capillary structure 400c is in a ring-shape and has a first curved section 410c, a second curved section 420c, two extension sections 430c, and a bridge section 440c. The first curved section 410c and the second curved section 420c are located opposite to each other. The first curved section 410c is located in the condensation area A2, and at least part of the second curved section 420c is located in the evaporation area A1. An orthogonal projection of the second curved section 420c onto the first cover 100 is located out of the area C of the contact surface 110 of the first cover 100. The extension sections 430c are located opposite to each other. The extension sections 430c are respectively located between and connected to the first curved section 410c and the second curved section 420c. One end of the bridge section 440c is connected to the second curved section 420c, and an orthogonal projection of another end of the bridge section 440c onto the first cover 100 is located in the area C of the contact surface 110 of the first cover 100. In such an arrangement, the cooling fluid in the condensation area A2 will be transmitted to the contact surface 110 in the evaporation area A1 via the second capillary structure 400c.

Figure 8:
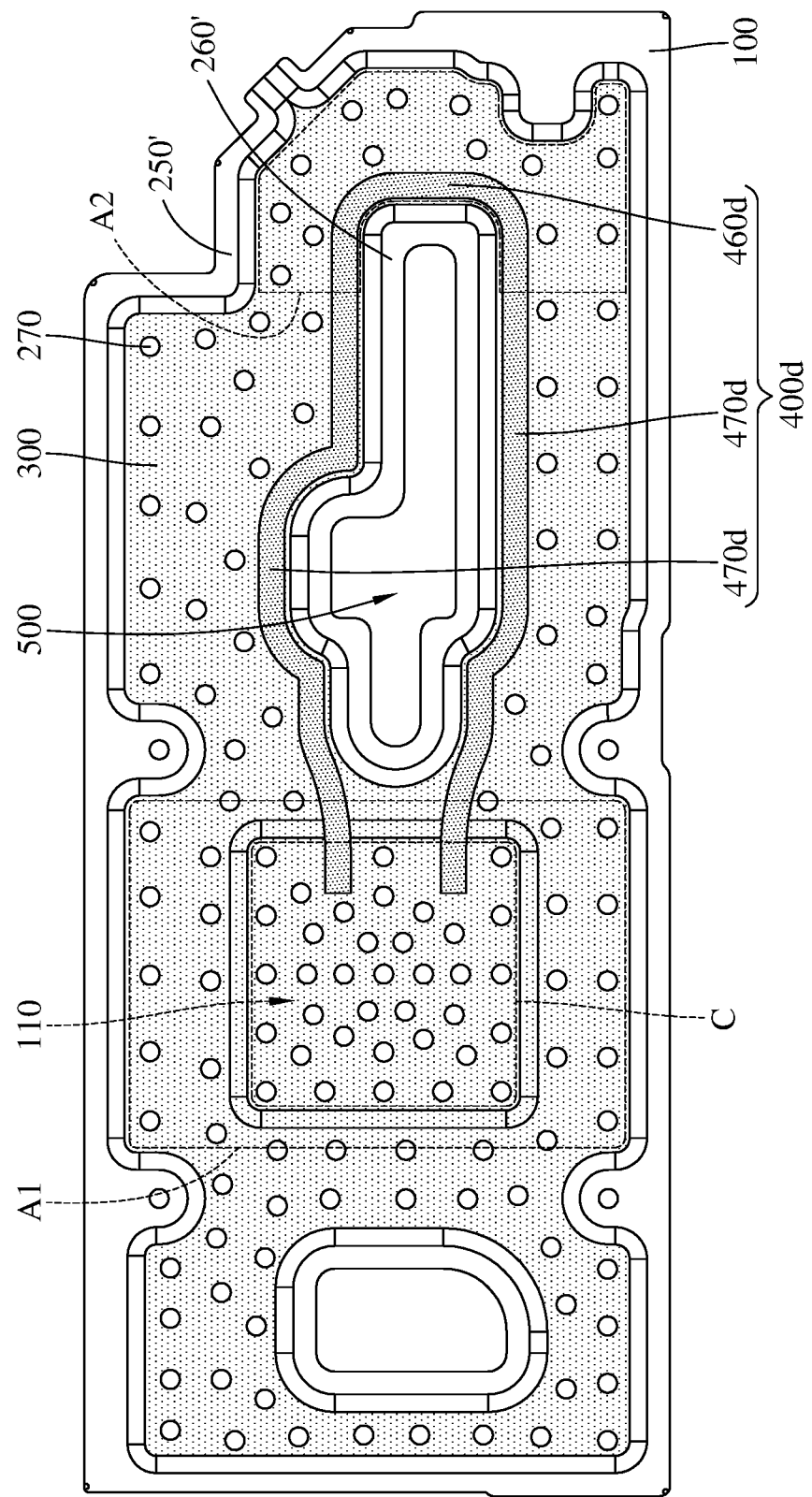
FIG. 8 is a plan view showing that a vapor chamber without a second cover according to a fifth embodiment of the present disclosure.
Figure 9:
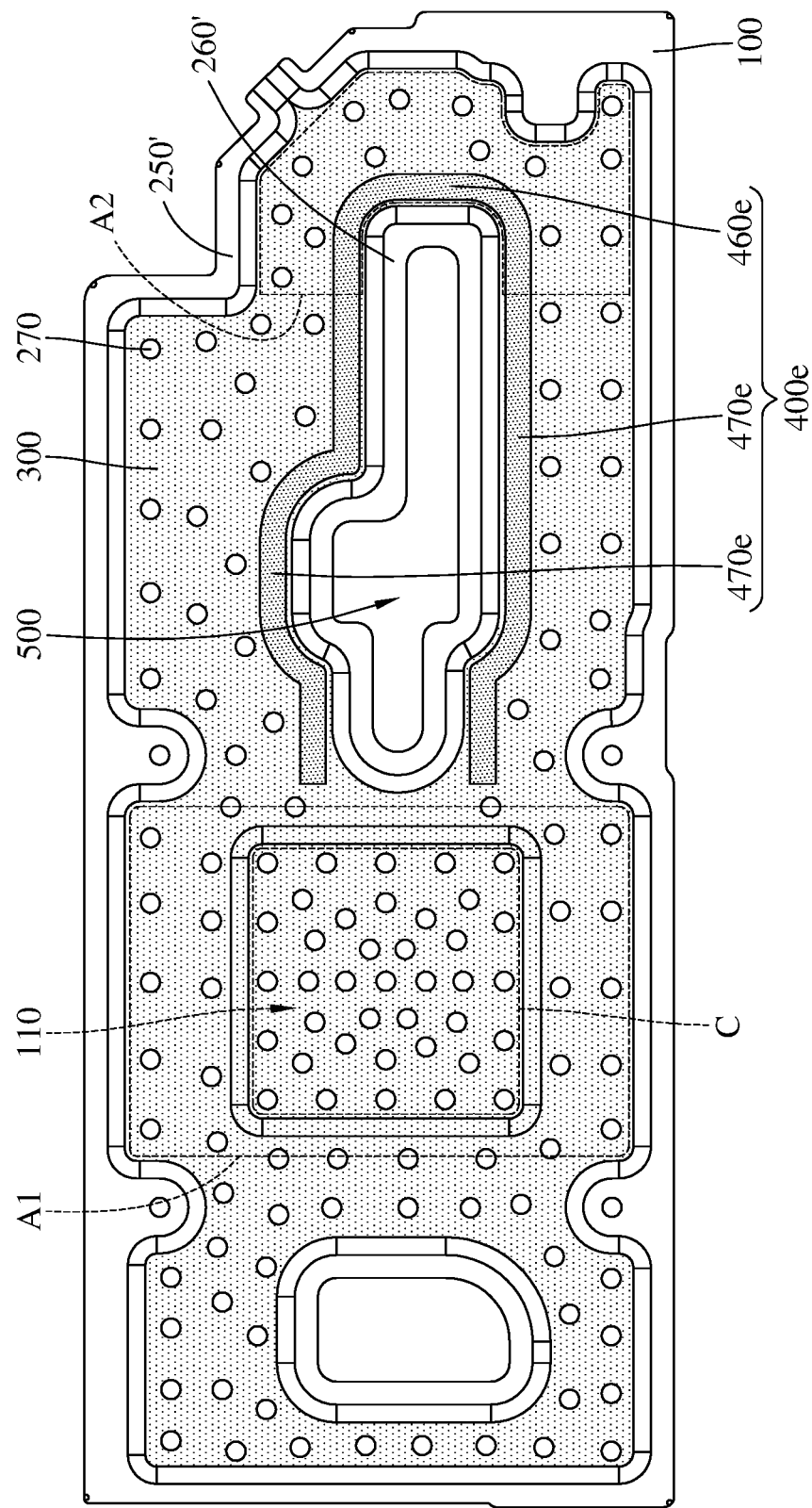
FIG. 9 is a plan view showing that a vapor chamber without a second cover according to a sixth embodiment of the present disclosure.

In the above embodiments, the second capillary structure is in a ring-shape. However, the present disclosure is not limited thereto. Please refer to FIG. 8 and FIG. 9, wherein FIG. 8 is a plan view showing that a vapor chamber without a second cover according to a fifth embodiment of the present disclosure, and FIG. 9 is a plan view showing that a vapor chamber without a second cover according to a sixth embodiment of the present disclosure. As shown in FIG. 8, in this embodiment, the second capillary structure 400d is in a U-shape and has a curved section 460d and two extension sections 470d. The curved section 460d is located in the condensation area A2. The extension sections 470d are located opposite to each other. The extension sections 470d are respectively connected to two opposite ends of the curved section 460d and extend towards the evaporation area A1. An orthogonal projection of an end of each of the extension sections 470d located away from the curved section 460d onto the first cover 100 is located in the area C of the contact surface 110 of the first cover 100. As shown in FIG. 9, the second capillary structure 400e is in a U-shape and has a curved section 460e and two extension sections 470e. The curved section 460e is located in the condensation area A2. The extension sections 470e are located opposite to each other. The extension sections 470e are respectively connected to two opposite ends of the curved section 460e and extend towards the evaporation area A1. An orthogonal projection of an end of each of the extension sections 470e located away from the curved section 460e onto the first cover 100 is located out of and substantially located next to the area C of the contact surface 110 of the first cover 100.

Figure 10:
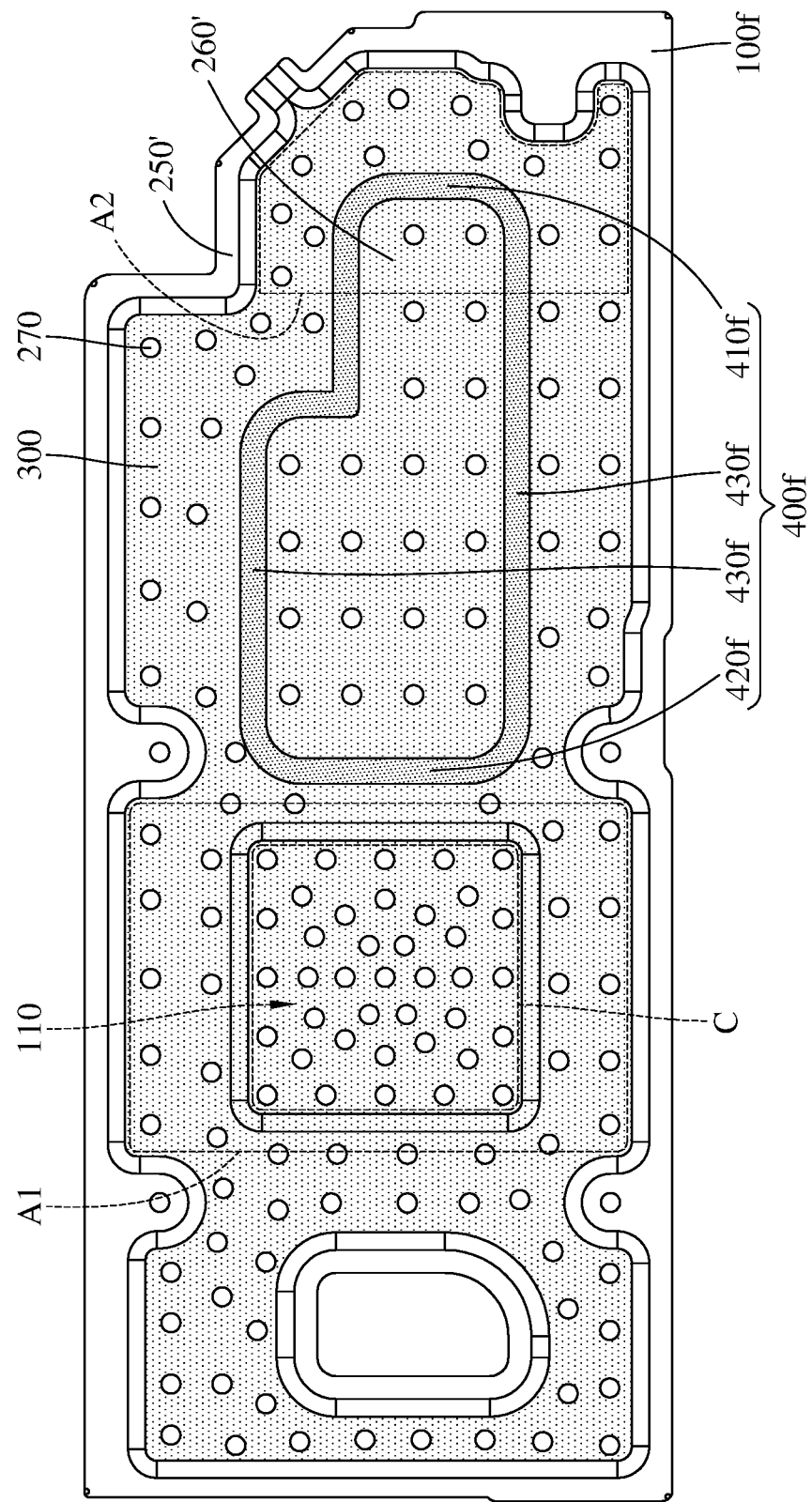
FIG. 10 is a plan view showing that a vapor chamber without a second cover according to a seventh embodiment of the present disclosure.

In the above embodiments, the vapor chamber 10 has a hollow part 500 (shown in FIG. 1). However, the present disclosure is not limited thereto. Please refer to FIG. 10, which is a plan view showing that a vapor chamber without a second cover according to a seventh embodiment of the present disclosure. In this embodiment, the orthogonal projection of the second capillary structure 400f onto the first cover 100f is located out of and substantially located next to the area C of the contact surface 110 of the first cover 100f. Specifically, the second capillary structure 400f is in a ring-shape and has a first curved section 410f, a second curved section 420f, and two extension sections 430f. The first curved section 410f and the second curved section 420f are located opposite to each other. The first curved section 410f is located in the condensation area A2, and the second curved section 420f is located next to the evaporation area A1. An orthogonal projection of the second curved section 420f onto the first cover 100f is located out of and substantially located next to the area C of the contact surface 110 of the first cover 100f. The extension sections 430f are located opposite to each other. The extension sections 430f are respectively located between and connected to the first curved section 410f and the second curved section 420f. In such an arrangement, the cooling fluid in the condensation area A2 will be transmitted to a place near the contact surface 110 in the evaporation area A1 via the second capillary structure 400f and then be transmitted to the contact surface 110 in the evaporation area A1 via the first capillary structure 300.

Figure 11:
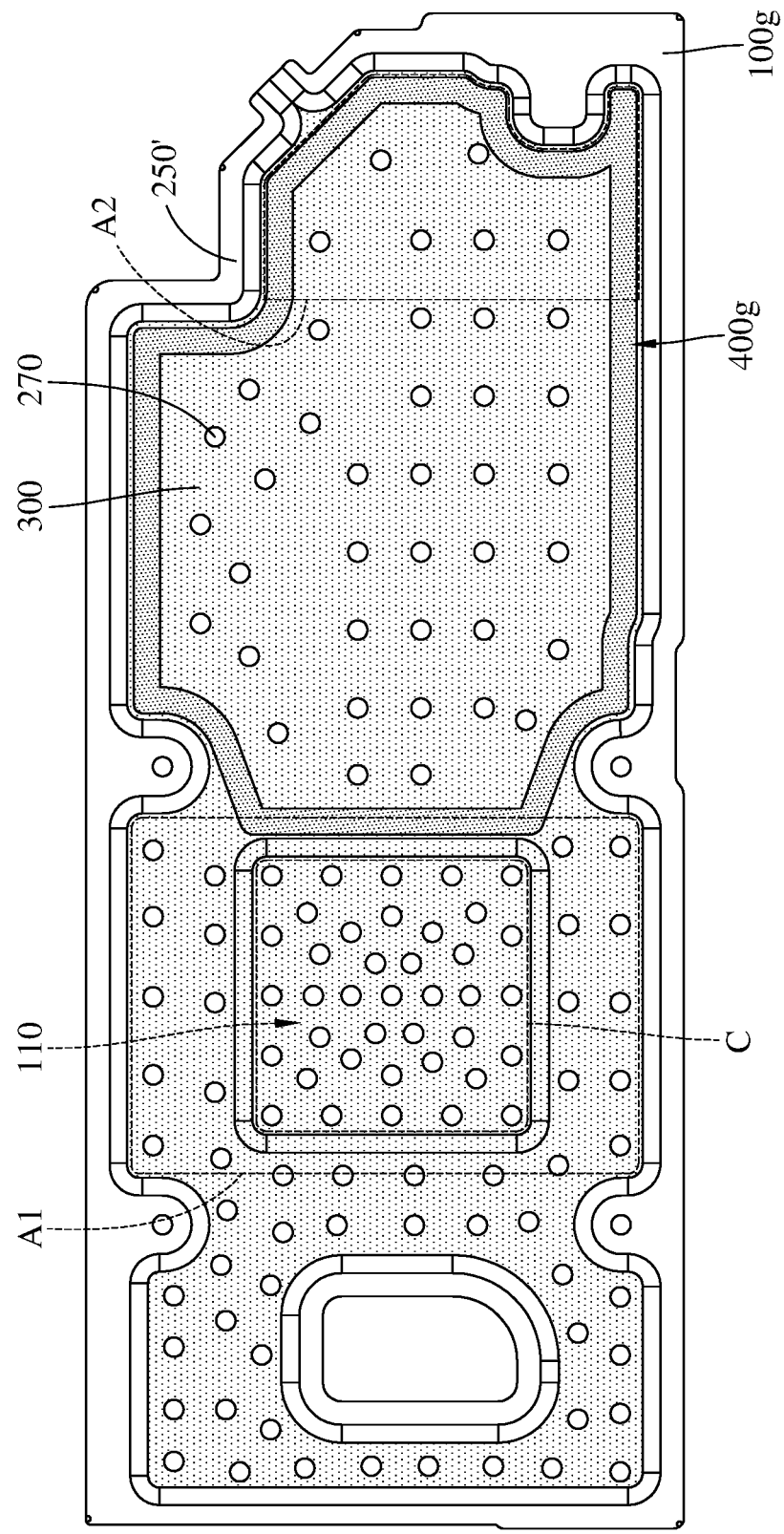
FIG. 11 is a plan view showing that a vapor chamber without a second cover according to an eighth embodiment of the present disclosure.

Please refer to FIG. 11, which is a plan view showing that a vapor chamber without a second cover according to an eighth embodiment of the present disclosure.

In this embodiment, the second capillary structure 400g is located close to the attachment surface 250' of the outer seal part 250 (shown in FIG. 1). Such an arrangement of the second capillary structure 400g in the chamber S makes the chamber S has a large available room for the vaporized cooling fluid to flow, ensuring the flowing of the cooling fluid in the chamber S.

Figure 12:
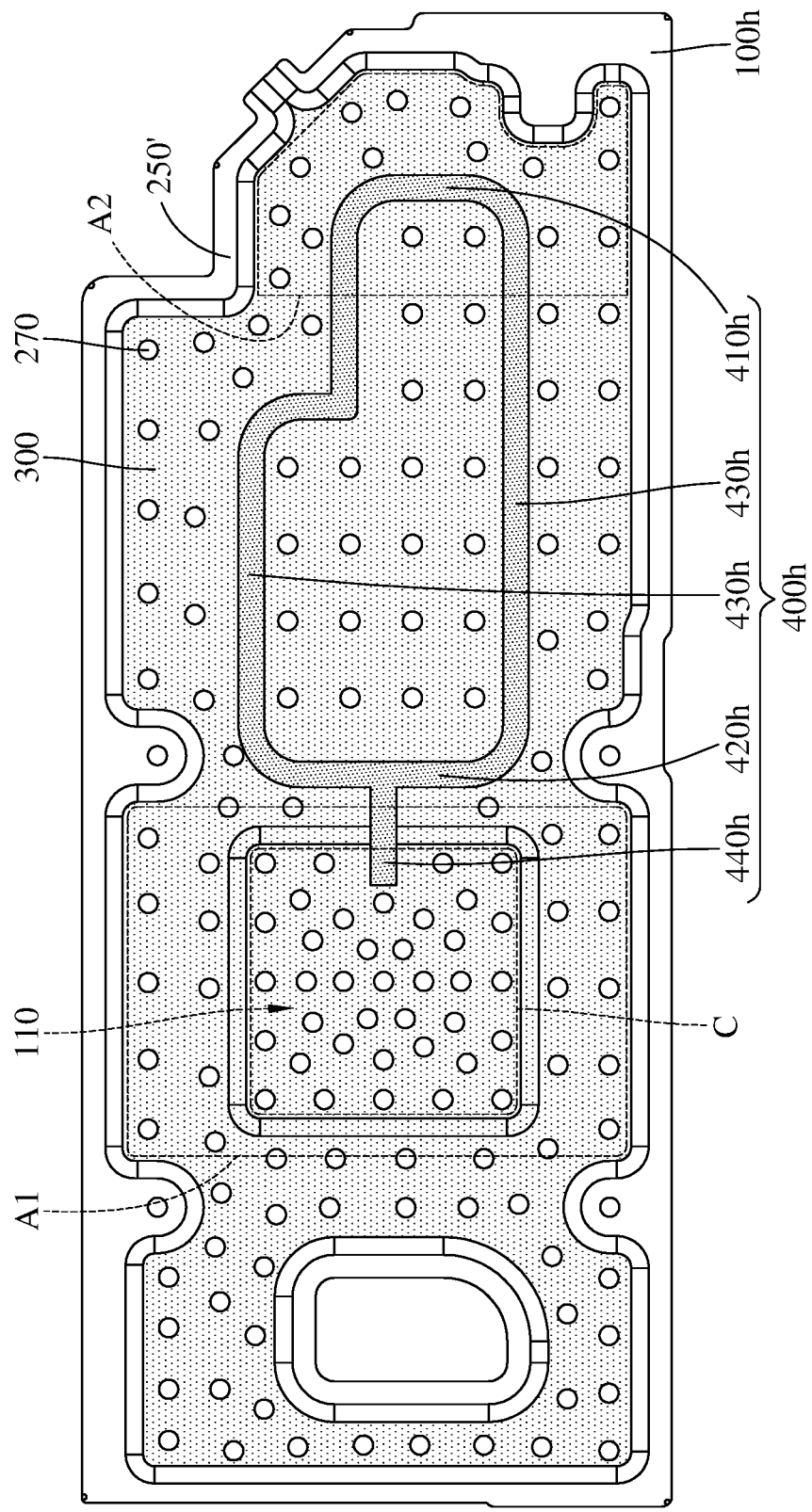
FIG. 12 is a plan view showing that a vapor chamber without a second cover according to a ninth embodiment of the present disclosure.

Please refer to FIG. 12, which is a plan view showing that a vapor chamber without a second cover according to a ninth embodiment of the present disclosure.

In this embodiment, part of the orthogonal projection of the second capillary structure 400h onto the first cover 100h is located in the area C of the contact surface 110 of the first cover 100h. Specifically, the second capillary structure 400h is in a ring-shape and has a first curved section 410h, a second curved section 420h, two extension sections 430h, and a bridge section 440h. The first curved section 410h and the second curved section 420h are located opposite to each other. The first curved section 410h is located in the condensation area A2, and the second curved section 420h is located next to the evaporation area A1. An orthogonal projection of the second curved section 420h onto the first cover 100h is located out of the area C of the contact surface 110 of the first cover 100h. The extension sections 430h are located opposite to each other. The extension sections 430h are respectively located between and connected to the first curved section 410h and the second curved section 420h. One end of the bridge section 440h is connected to the second curved section 420h, and an orthogonal projection of another end of the bridge section 440h onto the first cover 100h is located in the area C of the contact surface 110 of the first cover 100h. In such an arrangement, the cooling fluid in the condensation area A2 will be transmitted to the contact surface 110 in the evaporation area A1 via the second capillary structure 400h.

Figure 13:
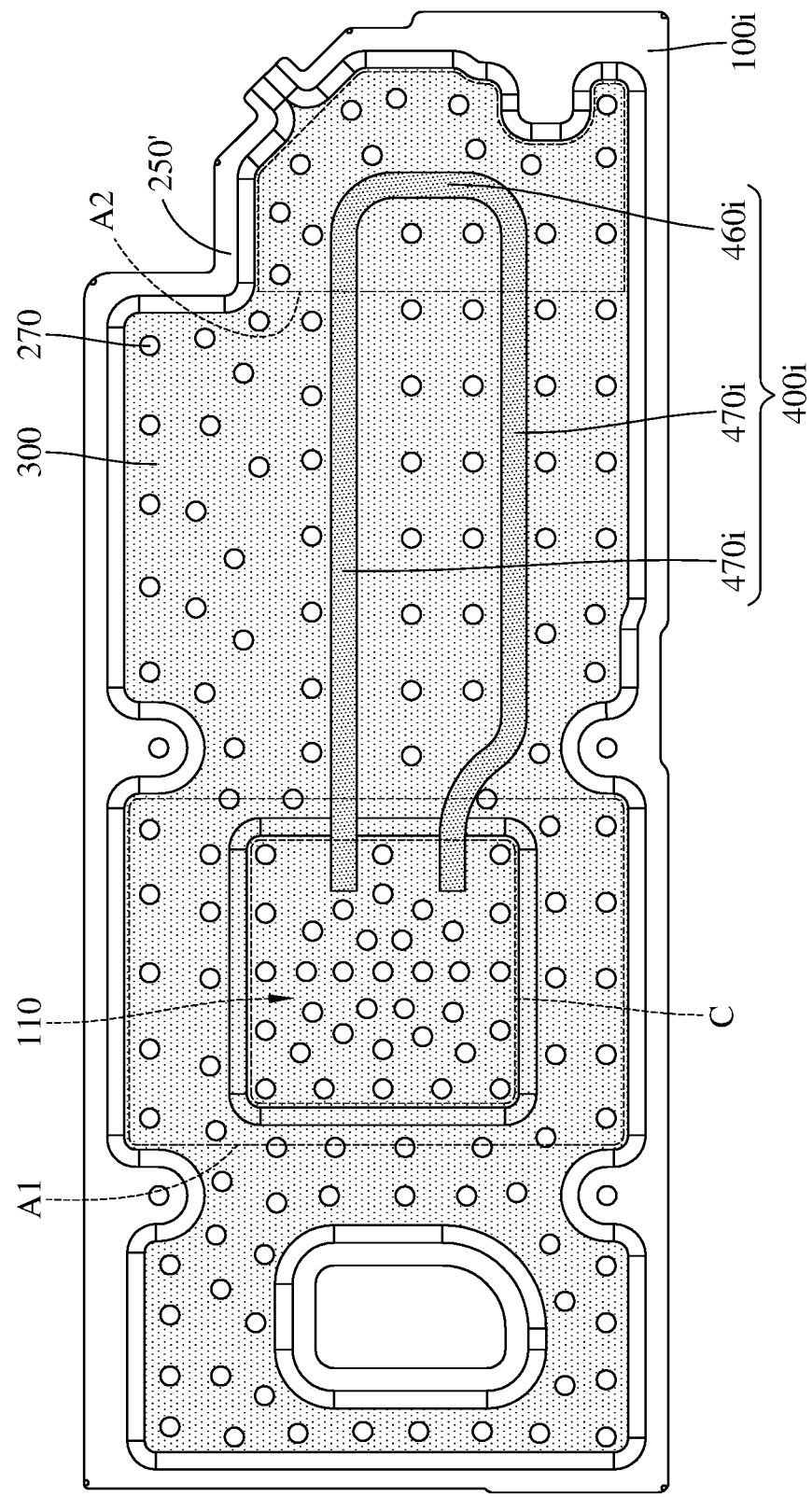
FIG. 13 is a plan view showing that a vapor chamber without a second cover according to a tenth embodiment of the present disclosure.
Figure 14:
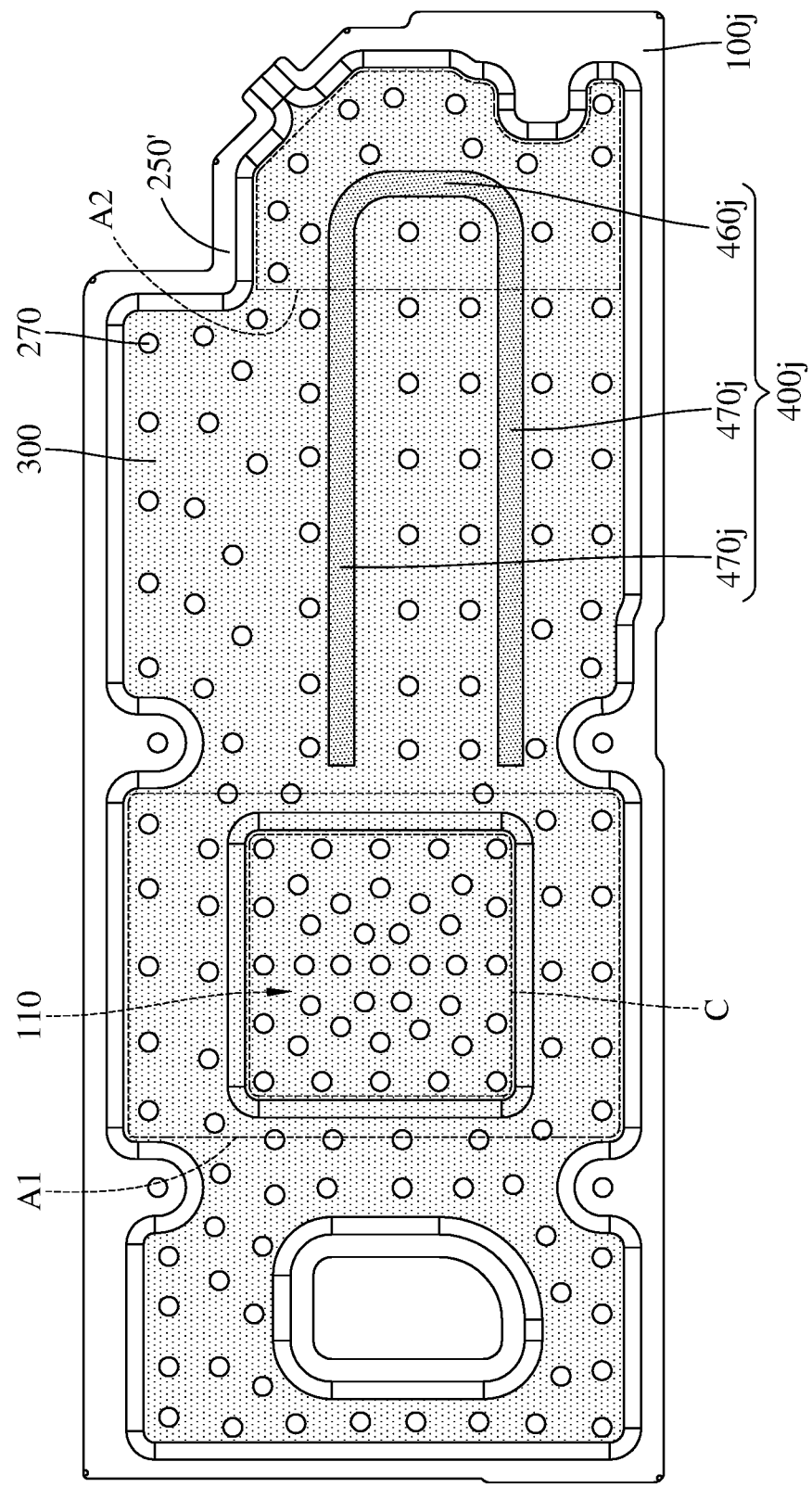
FIG. 14 is a plan view showing that a vapor chamber without a second cover according to an eleventh embodiment of the present disclosure.

Please refer to FIG. 13 and FIG. 14, wherein FIG. 13 is a plan view showing that a vapor chamber without a second cover according to a tenth embodiment of the present disclosure, and FIG. 14 is a plan view showing that a vapor chamber without a second cover according to an eleventh embodiment of the present disclosure.

As shown in FIG. 13, in this embodiment, the second capillary structure 400i is in a U-shape and has a curved section 460i and two extension sections 470i. The curved section 460i is located in the condensation area A2. The extension sections 470i are located opposite to each other. The extension sections 470i are respectively connected to two opposite ends of the curved section 460i and extend towards the evaporation area A1. An orthogonal projection of an end of each of the extension sections 470i located away from the curved section 460i onto the first cover 100i is located in the area C of the contact surface 110 of the first cover 100i. As shown in FIG. 14, the second capillary structure 400j is in a U-shape and has a curved section 460j and two extension sections 470j. The curved section 460j is located in the condensation area A2. The extension sections 470j are located opposite to each other. The extension sections 470j are respectively connected to two opposite ends of the curved section 460j and extend towards the evaporation area A1. An orthogonal projection of an end of each of the extension sections 470j located away from the curved section 460j onto the first cover 100j is located out of and substantially located next to the area C of the contact surface 110 of the first cover 100j.

Figure 15:
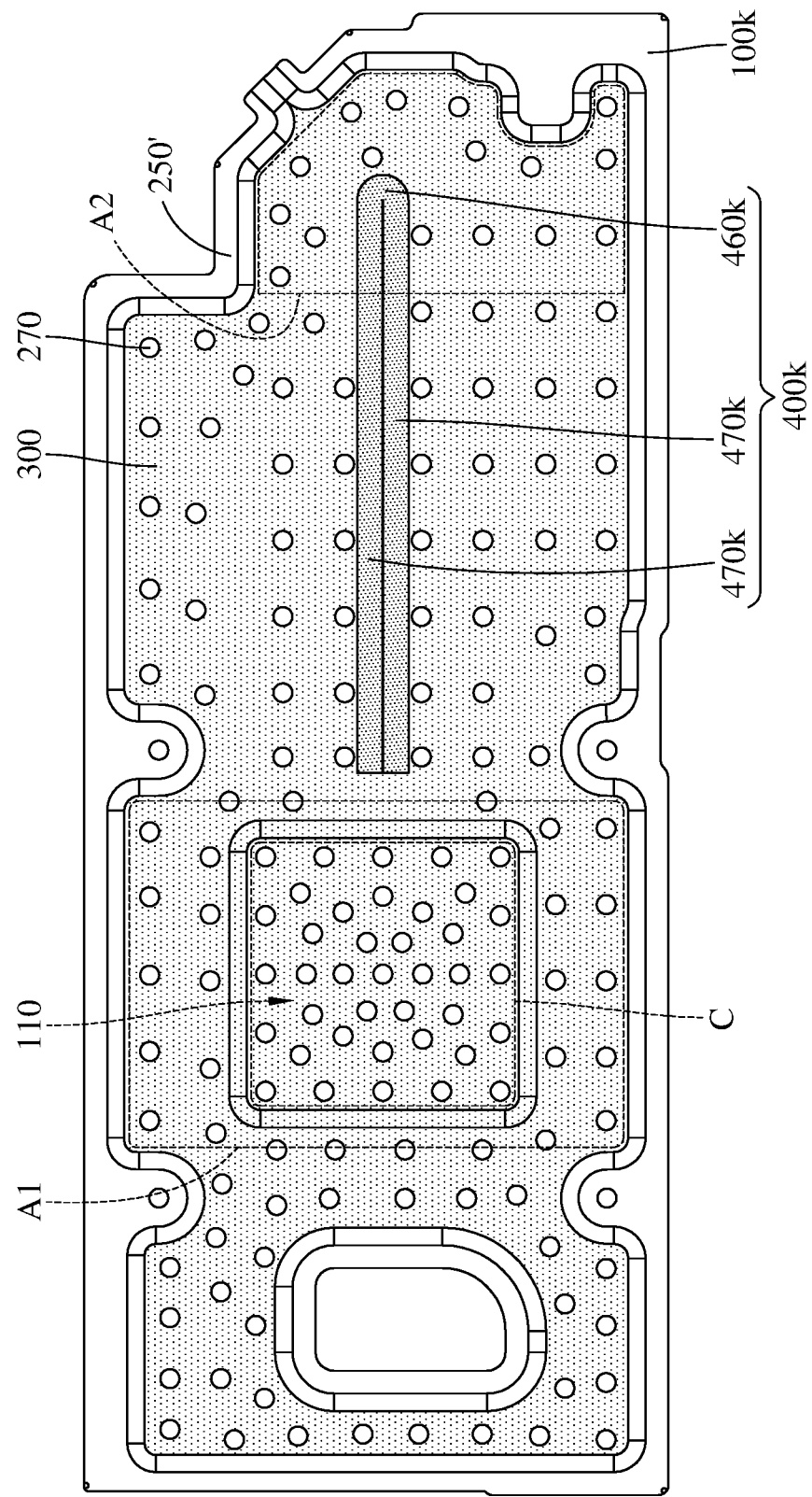
FIG. 15 is a plan view showing that a vapor chamber without a second cover according to a twelfth embodiment of the present disclosure.

In the above embodiments, the extension sections are spaced apart from each other. However, the present disclosure is not limited thereto. Please refer to FIG. 15, which is a plan view showing that a vapor chamber without a second cover according to a twelfth embodiment of the present disclosure. In this embodiment, the extension sections 470k abut to each other.

Note that the distribution area of the second capillary structure 400 may greater than or equal to the distribution area of the first capillary structure 300 with the premise that the second capillary structure 400 has a capability of transmitting the cooling fluid stronger than that of the first capillary structure 300. That is, the present disclosure is not limited to that the orthogonal projection of the second capillary structure 400 onto the first cover 100 is smaller than that of the first capillary structure 300 onto the first cover 100 with the premise stated above. Herein, the capability of transmitting the cooling fluid is proportional to the degree of capillary action.

In addition, in the above embodiments, the first capillary structure 300 is stacked on the first cover 100. However, the present disclosure is not limited thereto. In some embodiments, the first capillary structure may be stacked on the second cover.

According to the vapor chamber discussed above, when the vapor chamber is placed vertically and the evaporation area is located higher than the condensation area, or when the evaporation area and the condensation area have a relative long distance inbetween, the condensed cooling fluid in the condensation area still can be transmitted back to the evaporation area with the help of the second capillary structure and the first capillary structure to complete the circulation.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A vapor chamber, configured to accommodate a cooling fluid, and the vapor chamber comprising:
    a first cover, having a contact surface, wherein the contact surface is configured to be in thermal contact with a heat source, and;
    a second cover, wherein the second cover and the first cover are attached to each other to form a chamber therebetween, and the chamber is configured to accommodate the cooling fluid;
    a first capillary structure, wherein the first capillary structure is located in the chamber and stacked on the first cover;
    a second capillary structure, wherein the second capillary structure is located in the chamber and stacked on the first capillary structure, the second capillary structure is different from the first capillary structure, an entire projection of the second capillary structure onto the first cover is completely overlapped with a projection of the first capillary structure onto the first cover, there is an empty space located between the second cover and an entire surface of the second capillary structure opposite to the first capillary structure, the empty space has an entire projection onto the second cover not overlapped with a projection of the contact surface onto the second cover, and the empty space is configured for the cooling fluid to flow through;
    a plurality of supporting posts, wherein each of the plurality of supporting posts is in direct contact with the first cover and the second cover at two opposite sides thereof; and
    first and second irregularly-shaped hollow parts, formed through the first cover and the second cover, wherein the contact surface is located between the first and second irregularly-shaped hollow parts, and the second capillary structure surrounds the first irregularly-shaped hollow part.

2. The vapor chamber according to claim 1, wherein the chamber has an evaporation area and a condensation area, the evaporation area is wider than the condensation area, a side of the second capillary structure is located in the condensation area, and another side of the second capillary structure extends towards the evaporation area.

3. The vapor chamber according to claim 2, wherein the contact surface corresponds to the evaporation area, and the projection of the second capillary structure onto the first cover is located out of and substantially located next to the contact surface of the first cover.

4. The vapor chamber according to claim 3, wherein the second capillary structure has a first curved section, a second curved section, and two extension sections, the first curved section and the second curved section are located opposite to each other, the first curved section is located in the condensation area, at least part of the second curved section is located in the evaporation area, a projection of the second curved section onto the first cover is located out of the contact surface of the first cover, the two extension sections are located opposite to each other, and the two extension sections are respectively located between and connected to the first curved section and the second curved section.

5. The vapor chamber according to claim 2, wherein the second capillary structure abuts an inner seal part of the first cover located next to the first irregularly-shaped hollow part.

6. The vapor chamber according to claim 2, wherein the second capillary structure abuts an outer seal part of the first cover located away from the first irregularly-shaped hollow part.

7. The vapor chamber according to claim 1, wherein the second capillary structure is in thermal contact with the second cover.

8. The vapor chamber according to claim 1, wherein the second capillary structure is spaced apart from the second cover.

9. The vapor chamber according to claim 1, wherein the first capillary structure and the second capillary structure are made of different materials.

10. The vapor chamber according to claim 1, wherein the first capillary structure and the second capillary structure are different in form.

11. The vapor chamber according to claim 10, wherein the first capillary structure is in a form having mesh structure, and the second capillary structure is in a form having sintered powder structure.

12. The vapor chamber according to claim 10, wherein the first capillary structure is a metal mesh, and the second capillary structure is made from sintered powder.

13. The vapor chamber according to claim 1, wherein the first capillary structure is a metal mesh, and the second capillary structure is a metal mesh.

14. The vapor chamber according to claim 1, wherein the first capillary structure is distributed throughout the chamber, and the second capillary structure is distributed in part of the chamber.

15. The vapor chamber according to claim 1, wherein an orthogonal projection of the second capillary structure onto the first cover is smaller than an orthogonal projection of the first capillary structure onto the first cover.

16. A vapor chamber, configured to accommodate a cooling fluid, and the vapor chamber comprising:
    a first cover, having a contact surface, wherein the contact surface is configured to be in thermal contact with a heat source, and;
    a second cover, wherein the second cover and the first cover are attached to each other to form a chamber therebetween, and the chamber is configured to accommodate the cooling fluid;
    a first capillary structure, wherein the first capillary structure is located in the chamber and stacked on the first cover;
    a second capillary structure, wherein the second capillary structure is located in the chamber and stacked on the first capillary structure, the second capillary structure has a capability of transmitting the cooling fluid greater than that of the first capillary structure, an entire projection of the second capillary structure onto the first cover is completely overlapped with a projection of the first capillary structure onto the first cover, there is an empty space located between the second cover and an entire surface of the second capillary structure opposite to the first capillary structure, the empty space has an entire projection onto the second cover not overlapped with a projection of the contact surface onto the second cover, and the empty space is configured for the cooling fluid to flow through;
    a plurality of supporting posts, wherein each of the plurality of supporting posts is in direct contact with the first cover and the second cover at two opposite sides thereof; and
    first and second irregularly-shaped hollow parts, formed through the first cover and the second cover, wherein the contact surface is located between the first and second irregularly-shaped hollow parts, and the second capillary structure surrounds the first irregularly-shaped hollow part.

17. The vapor chamber according to claim 16, wherein the chamber has an evaporation area and a condensation area, the evaporation area is wider than the condensation area, a side of the second capillary structure is located in the condensation area, and another side of the second capillary structure extends towards the evaporation area.

18. The vapor chamber according to claim 17, wherein the contact surface corresponds to the evaporation area, and an orthogonal projection of the second capillary structure onto the first cover is located out of and substantially located next to the contact surface of the first cover.

19. The vapor chamber according to claim 18, wherein the second capillary structure has a first curved section, a second curved section, and two extension sections, the first curved section and the second curved section are located opposite to each other, the first curved section is locate in the condensation area, at least part of the second curved section is located in the evaporation area, an orthogonal projection of the second curved section onto the first cover is located out of the contact surface of the first cover, the two extension sections are located opposite to each other, and the two extension sections are respectively located between and connected to the first curved section and the second curved section.

20. The vapor chamber according to claim 16, wherein the second capillary structure is in thermal contact with the second cover.

21. The vapor chamber according to claim 16, wherein the second capillary structure is spaced apart from the second cover.

22. The vapor chamber according to claim 16, wherein the second capillary structure abuts an inner seal part of the first cover located next to the first irregularly-shaped hollow part.

23. The vapor chamber according to claim 16, wherein the second capillary structure abuts an outer seal part of the first cover located away from the first irregularly-shaped hollow part.

24. The vapor chamber according to claim 16, wherein the first capillary structure and the second capillary structure are made of different materials.

25. The vapor chamber according to claim 16, wherein the first capillary structure and the second capillary structure are different in form.

26. The vapor chamber according to claim 25, wherein the first capillary structure is in a form having mesh structure, and the second capillary structure is in a form having sintered powder structure.

27. The vapor chamber according to claim 16, wherein the first capillary structure is a metal mesh, and the second capillary structure is made from sintered powder.

28. The vapor chamber according to claim 16, wherein the first capillary structure is a metal mesh, and the second capillary structure is a metal mesh.

29. The vapor chamber according to claim 16, wherein the first capillary structure is distributed throughout the chamber, and the second capillary structure is distributed in part of the chamber.

* * * * *